United States Patent [19]

Park et al.

[11] Patent Number: 4,929,567
[45] Date of Patent: May 29, 1990

[54] METHOD OF MANUFACTURING A SELF-ALIGNED GAAS MESFET WITH T TYPE TUNGSTEN GATE

[75] Inventors: Hyung M. Park; Dong G. Kim, both of Daejeon, Rep. of Korea

[73] Assignees: Electronics and Telecommunications Research Institute, Daejeon; Korea Telecommunication Authority, Seoul, both of Rep. of Korea

[21] Appl. No.: 443,750

[22] Filed: Nov. 30, 1989

[30] Foreign Application Priority Data

Dec. 1, 1988 [KR] Rep. of Korea .......... 1988-15986[U]

[51] Int. Cl.$^5$ ............................................. H01L 21/265
[52] U.S. Cl. ............................. 437/41; 437/176; 437/912; 357/22
[58] Field of Search ............... 437/22, 41, 176, 912; 356/22 I

[56] References Cited

U.S. PATENT DOCUMENTS

| 4,601,094 | 7/1986 | Kikuchi et al. | 437/41 |
| 4,712,291 | 12/1987 | McLevige | 437/912 |
| 4,732,871 | 3/1988 | Buchmann et al. | 437/41 |
| 4,735,913 | 4/1988 | Hayes | 437/39 |
| 4,859,618 | 8/1989 | Shikata et al. | 437/41 |

FOREIGN PATENT DOCUMENTS

| 0161876 | 9/1984 | Japan | 437/176 |
| 0166080 | 7/1986 | Japan | 437/41 |
| 63-204772 | 8/1988 | Japan | 357/22 I |

*Primary Examiner*—Brian E. Hearn
*Assistant Examiner*—Trung Dang
*Attorney, Agent, or Firm*—Blakely, Sololoff, Taylor & Zafman

[57] ABSTRACT

The invention provides the method of manufacturing a self-aligned GaAs MESFET wherein the Si thin film formed by PECVD (Plasma Enhanced Chemical Vapor Deposition) and the $Si_3N_4$ film formed by PCVD (Photo Chemical Vapor Deposition) onto the GaAs substrate are used as the capping film in the activation process, and then the self-aligned MESFET with the T type gate is manufactured through the selective chemical vapor deposition of the tungsten onto the Si thin film. As a result, the gap between the gate electrode and the n+ layer can be adjusted itself.

4 Claims, 3 Drawing Sheets

METHOD OF MANUFACTURING A SELF-ALIGNED GAAS MESFET WITH T TYPE TUNGSTEN GATE

BACKGROUND OF THE INVENTION

The present invention relates to a method of forming a self-aligned MESFET with T type gate by means of selective chemical vapor deposition of the tungsten (W) onto a silicon(Si) thin film.

The self-aligned MESFET is formed as a structure controlling the gap between the gate electrode and the n+ layer by using the T type multiple resists or the refractory metals. Such self-aligned MESFET has small parasitic resistance due to n surface depletion layer by forming n+ layer underneath a gate metal edge, and small parasitic gate capacitance by preventing transverse diffusion of n+ layer to the gate electrode.

As the representative self-aligned MESFET's, there are a SAINT(Self-Aligned Implantation of N+-layer Technology) and a SACSET(Sidewall-Assisted Closely-Spaces Electrode Technology) MESFET's.

The SAINT MESFET was complicated due to the process using T type multiple resists for forming the gate, and the process forming a gate being used practically thereto after removing the dummy gate. As well, the volitilization of the arsenic(As) has to be prevented there by specially forming a capping film in the activating process.

A SACSET MESFET is easy to suffer from damage of a substrate due to the reactive ion etching as the dry etching method when forming the gate electrode with an insulating layer in both side walls. Also, in the activating process, the mechanical and thermal stress occurred between the refractory metal electrodes and the insulation layers formed by both sidewalls, therefore has a bad effect upon devices.

SUMMARY OF THE INVENTION

It is an object of the present invention to provide a self aligned MESFET for minimizing contamination problems occurred when the GaAs substrate is exposed to the air and mechanical damages occurred when the gate electrode is deposited, for preventing the volitilization of As occurred on the activation process performed at high temperature, and also for reducing the complexity of the process using the multiple resists when forming the gate electrode by the conventional SAINT process.

To achieve above object, the invention provides the method of manufacturing a self-aligned GaAs MESFET wherein the Si thin film formed by PECVD (Plasma Enhanced Chemical Vapor Deposition) and the $Si_3N_4$ film formed by PCVD (Photo Chemical Vapor Deposition) onto the GaAs substrate are used as the capping film in the activation process, and then the self-aligned MESFET with the T type gate is manufactured through the selective chemical vapor deposition of the tungsten onto the Si thin film. As a result, the gap between the gate electrode and the n+ layer can be adjusted itself.

BRIEF DESCRIPTION OF THE DRAWINGS

The invention will be readily understood from the following more detailed description presented in conjunction with the following drawings, in which.

DESCRIPTION OF THE PREFERRED EMBODIMENT

Figure 1A:
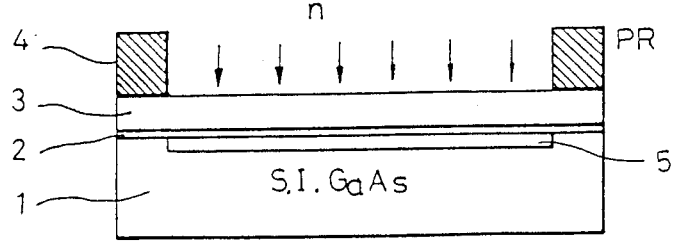
FIG. 1A is a diagram showing a process of ion implantation for n active layer.

Referring now to the drawings, there is shown an embodiment of the present invention.

Figure 1B:
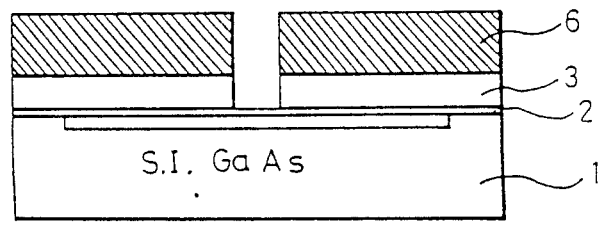
FIG. 1B is a diagram showing a process of etching the $Si_3N_4$ film.
Figure 1C:
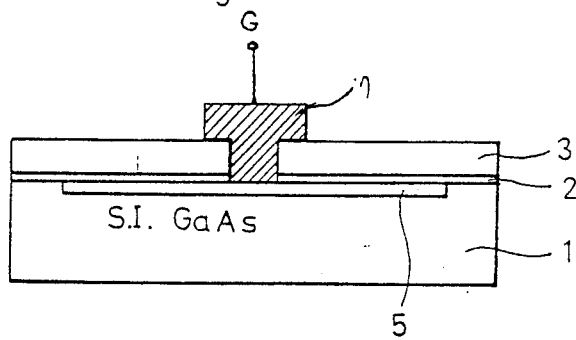
FIG. 1C is a diagram showing the selective chemical vapor deposition of the tungsten.
Figure 1D:
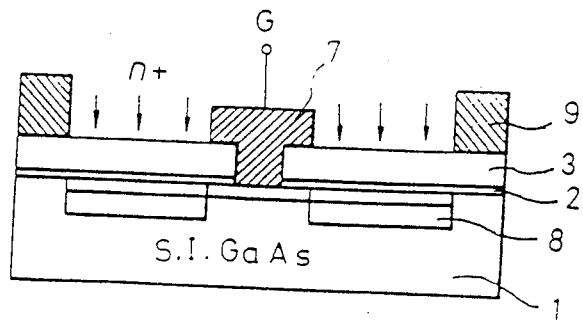
FIG. 1D is a diagram showing a process of ion implantation for n+ active layer.
Figure 1E:
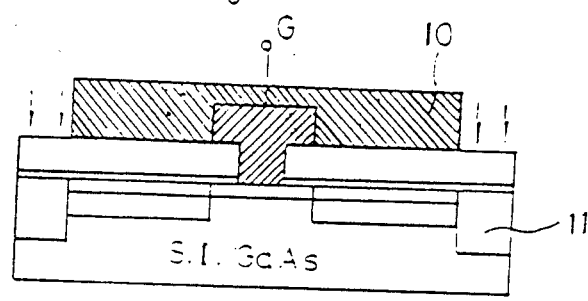
FIG. 1E is a diagram showing a process of isolating between devices.
Figure 1F:
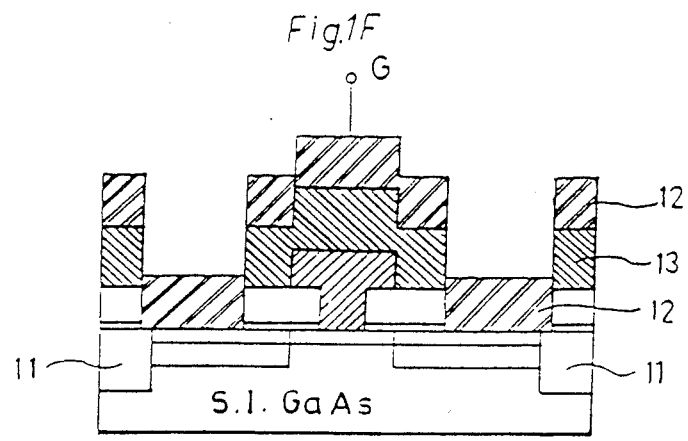
FIG. 1F is a diagram showing a process of etching $Si_3N_4$ and Si and that of depositing the ohmic metal.
Figure 1G:
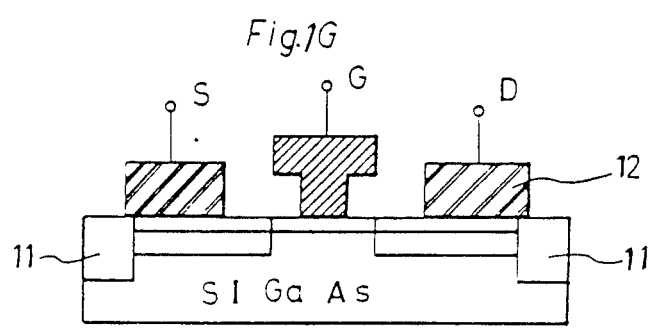
FIG. 1G is a diagram showing a completed self-aligned MESFET with the T type tungsten gate.

FIG. 1A shows the process diagram of ion implantation for n active layer, FIG. 1B that of etching the $Si_3N_4$ film, FIG. 1C that of the selective chemical vapor deposition of the tungsten, FIG. 1D that of ion implantation for n+ active layer, FIG. 1E that of isolation between devices, FIG. 1F that of etching $Si_3N_4$ and Si and that of deposition of the ohmic metal (AuGe/Ni), FIG. 1G the completed self-aligned MESFET with the T type gate, respectively.

In the drawings, 1 indicates the semi-insulating GaAs substrate, 2 the silicon thin film, 3 the $Si_3N_4$ film, 4 the photoresist, 5 the n ion implanted layer, 6 the photoresist, 7 the T type tungsten gate, 8 the n+ ion implanted layer, 9 and 10 the photoresists, 11 the ion implanted layer for isolation, 12 the ohmic metal (AuGe/Ni) layer, 13 the photoresist, respectively.

After deposition of the silicon(Si) thin film 2 with the thickness of 100–200 Å onto entire surface of the semi-insulation GaAs substrate by PECVD (Plasma Enhanced Chemical Vapor Deposition) method, the $Si_3N_4$ film 3 is deposited there to the thickness of 1000 Å by PCVD(Photo Chemical Vapor Deposition) in the first process (FIG. 1A).

As the experimental conditions at this time, the temperature of the substrate is 100°–200° C., the reaction pressure 1–10 Torr, the flow rate of $SiN_4$ and $NH_3$ 3–10 sccm and 15–500 sccm, respectively.

After the deposition of the silicon film 2 and the $Si_3N_4$ film 3, Si+ are ion implanted with the condition of 70–100 Kev, $1-6\times10^{12}/cm^2$ with using the photoresist 4 as a mask.

For forming a gate electrode the second process (FIG. 1B) is to define the gate pattern by etching the $Si_3N_4$ film 3 with using the photoresist 6 as a mask. As etching solution, BOE(Buffered Oxide Etchant) 6:1 is used.

The third process (FIG. 1C) is to deposit the tungsten 7, which is a gate electrode, by the selective chemical vapor deposition method.

For depositing the tungsten 7 selectively onto the exposed Si thin film, the substrate temperature is 350°–450° C., the reaction pressure 0.2–1 Torr, the flow rate of $WF_6$ and argon gas 5–10 sccm and 1000 sccm, respectively.

The reaction equation at this time is as follows.

$$2WF_6 + 3Si \rightarrow 3SiF_4 + 2W \ldots \quad (1)$$

By this reaction the tungsten thin film is grown to the thickness of 100 Å with consuming the silicon thin film 2 and stops being grown.

For further growing a tungsten gate electrode 7 with the thickness of 1500-2000 Å, the fourth process is to add hydrogen gas besides $WF_6$ and argon gas.

By adjusting the reaction pressure to 0.6-2 Torr and by controlling the flow rate of hydrogen gas within 100-500 sccm, as not changing the substrate temperature, the tungsten film is grown to the surface level of $Si_3N_4$ film 3 and then keeps on being grown transversely. As a result, the T type gate electrode 7 is formed.

The reaction equation at this time is as follows.

$$WF_6 + 3H_2 \rightarrow W + 6HF \ldots \quad (2)$$

It is important for the above gate electrode 7 to have T profile.

Forming n+ active layer that is next process lessens parasitic resistance due to n surface depletion layer and simultaneously preventing transverse diffusion of n+ layer down to the gate metal can reduce parasitic gate capacitance.

The fifth process (FIG. 1D) is to ion implant for forming a n+ active layer 8 using the T type tungsten gate 7 as a mask.

At this time, the gap between the gate 7 and the n+ active layer 8 has to be 1000-2000 Å.

The ion implantation is followed by post implantation annealing, to activate n ion implanted layer 5 and n+ ion implanted layer 8.

At this time, the Si thin film 2 and the $Si_3N_4$ film 3 play an effective role as a capping film for preventing the volatilization of As, deposited by ion implantation and PCVD, respectively. So there is no need of depositing a capping film independently for the activation process.

The sixth process (FIG. 1E) is to form a B+(or H+) isolation implanted region 11 through the Si thin film 2 and the $Si_3N_4$ film 3 with the condition of 100-200 Kev using the photoresist 10 as a mask for isolating between MESFET's.

The seventh process (FIG. 1F) is to etch the Si thin film 2 and the $Si_3N_4$ film 3 using the photoresist 13 as a mask, for defining a source and a drain.

And then, a lift-off technique is used to define the ohmic metal(AuGe/Ni) pattern to form the source and drain electrodes 12.

At this time, the alloying is carried out at a temperature of 430 C for 5 min in hydrogen ($H_2$): nitrogen ($N_2$) (30:70) gas atmosphere.

FIG. 1G shows a self-aligned MESFET with the T type tungsten gate electrode completed by the process described above.

By the invention mentioned above, the self-aligned MESFET with the T type gate is manufactured through the selective chemical vapor deposition of the tungsten onto the si thin film. As a result, the gap between the gate electrode and the n+ layer can be adjusted itself. Also the contamination problems occurred when being exposed to the air as well as the chemical damages occurred when depositing a gate electrode by the sputtering method are minimized, the volatilization of As occurred in the activating process performed at high temperature is prevented, and the simplicity of process is achieved.

What is claimed as:

1. A method of manufacturing a self-aligned MESFET with T type gate electrode of the tungsten comprising the processes of:

depositing a silicon (Si) thin film onto entire surface of a semi-insulating GaAs substrate by PECVD(plasma enhanced chemical vapor deposition), depositing a $Si_3 N_4$ film onto the silicon (Si) thin film by PCVD (photo chemical vapor deposition), and ion implanting for a n active layer using a photoresist as a mask;

forming a gate electrode pattern by etching said $Si_3N_4$ film using a photoresist as a mask to form the gate electrode;

growing the tungsten by selective chemical vapor deposition only onto the exposed Si thin film in order not to deposit the tungsten onto said $Si_3N_4$ film;

growing the tungsten film transversely for forming a tungsten gate electrode with T type;

forming a n+ layer by ion implantation so that the gap between said gate electrode and said n+ layer is 1000 Å through 2000 Å using said T type tungsten gate;

activating said n and n+ layer using said Si thin film and $Si_3N_4$ film as a capping film;

ion implanting for said n and n+ active layers and for isolation between devices through said Si thin film and $Si_3N_4$ film;

etching said Si thin film and $Si_3N_4$ film and depositing an ohmic metal (AuGe/Ni) by a lift-off technique using a photoresist as a mask to form a source and a drain.

2. A method of manufacturing a self-aligned MESFET according to claim 1, wherein said process of depositing the tungsten selectively only onto the Si film is carried out under the condition that the substrate temperature is 350° through 450° C., the reaction pressure is 0.2 through 1 Torr, and the flow rate of $WF_6$ and argon gas are 5 through 10 sccm and 1000 sccm, respectively.

3. A method of manufacturing a self-aligned MESFET according to claim 1, wherein the thickness of said Si thin film and $Si_3N_4$ film as the capping film in said process, are 100 through 200 Å and 1000 Å, respectively.

4. A method of manufacturing a self-aligned MESFET according to claim 1, wherein said process of depositing the tungsten electrode with T type is carried out under the condition that the substrate temperature is 350° through 450° C., the reaction pressure is 0.6 through 2 Torr, and the flow rates of $WF_6$, $H_2$ and Ar gases are 50 through 1000 sccm, 100 through 500 sccm, and 1000 sccm, respectively.

* * * * *